United States Patent [19]

Hall et al.

[11] 3,773,704

[45] Nov. 20, 1973

[54] WATER SOLUBLE PROTECTIVE COATING

[75] Inventors: Robert McDowell Hall; Jimmie Joe Mumm, both of Portland, Oreg.

[73] Assignees: Tektronix, Inc., Beaverton; Indusco Chemical Products, Portland, both of Oreg.

[22] Filed: Nov. 8, 1971

[21] Appl. No.: 196,798

[52] U.S. Cl. .......................... 260/33.8 R, 260/37 AL

[51] Int. Cl. .......................... C08g 51/30

[58] Field of Search .......................... 250/33.8 R; 117/5.5

[56] References Cited

UNITED STATES PATENTS 3,262,900 7/1966 Schreiber .......................... 260/29.6

*Primary Examiner*—Lewis T. Jacobs

*Attorney*—Adrian J. Larue

[57] ABSTRACT

The present invention relates to a protective coating for application onto selected areas of a member to prevent another material from adhering thereto when this other material is applied onto selected areas of the member; whereafter the protective coating is removed via water due to its water soluble characteristics.

9 Claims, No Drawings

WATER SOLUBLE PROTECTIVE COATING

BACKGROUND OF THE INVENTION

A number of methods are well known that enable a surface or selected areas thereof to have applied thereto a material. Among these methods are the application of solder to selected areas on a printed circuit board, the application of a coating material onto a member such as applying paint onto a member, and applying metal onto selected areas of a member as by vacuum metalizing, chemical or electroless plating or electroplating. This invention is particularly useful in soldering methods employing a flux applicator, solder bath and cleansing medium.

Various materials are known as masking compositions. One of these is a rubber-based composition which is applied onto selected areas of a printed circuit board to prevent solder from adhering to these coated areas. A long time is required for this rubber-based coating composition to dry, it is non-soluble in water and conventional solvents and it has to be manually removed from holes that have been masked thereby which is time consuming. Another material is a liquid composition which is slow drying even though it is water soluble and it is clear which creates a problem with visibility. A further method is the use of masking tape or tape strips which are not water soluble and have to be manually removed. Masking tape or tape strips are available which are water soluble, but it is time consuming to manually apply them onto selected areas of the printed circuit boards. The use of masking tape or tape strips is expensive material-wise as well as time-wise.

SUMMARY OF THE INVENTION

This invention is directed to an improvement in the soldering of components to printed circuit boards wherein a portion not to be soldered is masked with a coating and the printed circuit board so masked is passed over a fluxing area, across a flow solder bath and the masking composition is readily removed by water or some harmless cleansing material. The invention comprises applying to the areas to be masked a coating of a water soluble material which is prepared from at least one solvent selected from the group consisting of chlorinated solvents and at least one amine selected from the group consisting of alkanolamines.

A primary object of the present invention is to provide, as a mask in a soldering process, a coating composition that is easily applied and removed by an agent which will not have a deleterious effect on the surface of the printed circuit board.

Another object of the present invention is to employ as a mask a coating composition that is easily removable with water and thus avoid manual removal, harmful organic solvents and time consuming handling of the finished article.

A further object of the present invention is the provision of a masking composition that is readily applied to the member by conventional techniques.

An additional object of the present invention is to provide a masking composition that is air dried at room temperature.

Still a further object of the present invention is the provision of a masking composition that dries rapidly at room temperature.

A still additional object of the present invention is to provide a masking composition that considerably increases production, simplifies masking and is less expensive.

These and other objects will become apparent in the following description of the invention and claims.

DETAILED DESCRIPTION OF THE INVENTION

Typical substrate materials and metals onto which the masking composition is to be used are the various conventional materials and metals that are used to form printed or etched circuit boards and the present invention will be described in conjunction with masking selected areas of printed circuit boards in order to prevent solder from adhering thereto when the printed circuit boards are subjected to a soldering operation. It is to be understood, however, that the masking composition can be used in conjunction with the necessity to mask areas on any member to prevent another material from coating the masked area or areas when applied to the member.

The masking composition of this invention is a water soluble coating that is applied to the surface to be protected by conventional means, then dried and subsequently removed by water or a mild alkaline agent.

The compositions of the invention comprise several ingredients to form a dispersion. A suitable solvent of 90–95 percent by weight of methylene chloride is preferred, while other chlorinated hydrocarbons such as carbon tetrachloride, ethylene dichloride, trichloroethylene and perchloroethylene can be effectively used. Chlorinated solvents are desirable since they are not flammable. Ethanol, isopropanol, amylalcohol, butanol and benzene can be used, but they are less desirable since they are flammable.

An amine of 0.4 to 1.5 percent by weight, which is preferably monoethanolamine, is dissolved in the solvent to provide alkalinity and to inhibit hydrolysis of chlorinated solvents. It reacts with rosin flux when the printed circuit passes over a flux-applying area thereby forming soap film which improves removal in water or removing agent and also improves resistance to solder. Other alkanolamines that can be used are diethanolamine, triethanolamine, monoisopropanolamine, di-isopropanolamine and tri-isopropanolamine. Morpholine, N-methyl morpholine and N-ethyl morpholine can also be used.

A 3–5 percent by weight of diatomaceous earth is included as an ingredient; it must be finely divided and of low density to prevent settling. Average particle size is 1–2 microns and the preferable size is about 1 micron and the screen analysis is 0.5 percent through a 325 mesh screen. The specific gravity is 2.1 of the diatomaceous earth which permits the particles to remain in suspension. Other silica forms, so long as they are very fine and low density, can be used. The diatomaceous earth functions as a heat sink, pigmentation to improve water solubility of resin and opaque residue to easily identify coated areas.

A polymer resin of 0.7 to 0.9 percent by weight is one of the ingredients and it is identified as polyethylene oxide homopolymer having a molecular weight of 100,000 to 5,000,000. The water soluble polyoxyethylene that is utilized has a viscosity at 25° C. of 225 cps. to 4000 cps. Those polymers which are preferred within this range have a viscosity prior to dilution for use in the present masking compositions as measured in a 5 percent aqueous solution at 25° C. of 1,500 to 2,000 cps. (POLYOX WSR205, tradename) in addition to those polymers that have a viscosity at 25° C. in a 1 percent aqueous solution of 2,000 to 4,000 cps. (POLYOX WSR301, tradename). Viscosity in relation to ethylene oxide polymers is measured by a Brookfield viscometer PUF at two rpm using the largest spindle for the desired scale.

The polymer resin functions as a binder for the pigment, provides water solubility, provides adhesive properties to film, acts as a film former and provides viscosity for bridging across holes to be coated to prevent solder from adhering to metal-coated inner surfaces thereof. The viscosity is selected to range from liquid to paste depending on the size of holes to be covered. The more viseous the composition, the slower the drying thereof.

Methyl cellulose, which is sold under the trademark METHOCEL by Dow Chemical Company, can be used as a binder in place of the polyoxyethylene as a binder, but it is not as quick drying, more is needed to obtain desired viscosity, it is susceptible to heat of a solder bath and it needs an alcohol solvent to make it more soluble which is acceptable when heat is not a factor but unacceptable when the coating composition is used in a solder application in accordance with the preferred use of the present invention.

Other ingredients in addition to those recited hereinabove may efficaciously be included in the formulation of the present compositions. Thus, in order to increase water solubility and lower surface tension to spread the masking composition, a nonionic surfactant of 0 to 1.5 percent by weight can be added and it comprises a biodegradeable modified alcohol defined as an alkylaryl polyether alcohol having 5 to 40 carbon atoms which is provided under the trademark TRITON by Rohm and Haas. A trace of dye is preferably added to the compositions in the form of rhodamine pink sulfa or other suitable heat-resistant dyes in order to provide identification to the composition and to show the presence and boundaries on the surfaces on which the coating composition is applied.

The compositions of the invention are prepared by admixture of the ingredients in the proportions indicated. The present invention provides masking compositions that dry in a short period of time such as, a minute more or less, they are highly visible since they are colored and opaque, they are not flammable and will not interfere with sewage systems, they can readily be removed by a warm water rinse, by various solutions such as, for example, Freon, chlorothane or halogenated solvents, or by dry brushing with a nylon bristle brush or the like. They remain in place during solder machine operations and keep the solder from areas not to receive solder. The masking compositions are easily applied onto selected areas by means of an applicator-type plastic bottle thereby simplifying masking process which considerably speeds up production, and they are less expensive to use than existing masking compositions.

Example 1

Printed circuit boards have applied thereto electrical components in the form of transistors, capacitors, resistors, inductances, sockets and the like. Selected areas of the conductive areas of the printed circuit boards are not to have solder applied thereto and these need to be provided with a protective or masking coating in order to prevent the solder from adhering thereto. The following ingredients in the quantities indicated are then admixed to provide the masking composition:

| | % |
|---|---|
| Methylene chloride | 95.10 |
| Monoethanolamine | 0.46 |
| Diatomaceous earth | 3.71 |
| Polymer resin | 0.73 |
| Total | 100.00 |
| Dye | Trace |

The masking composition thus formulated is applied onto the selected areas of the conductive or other areas of the printed circuit boards on which solder is not to adhere. The printed circuit boards are passed over a fluxing area to apply flux to the areas which are to be soldered. The printed circuit boards are then moved along a flow solder bath and the areas to be soldered are soldered while the coated areas prevent solder from adhering thereto. After the soldering operation, the soldered boards are passed through a cleaning area comprising a conventional alkaline detergent to remove the protective coating from the boards, the detergent also removes flux from the boards; otherwise a warm water rinse can be used as well as an alcohol solvent.

Example 2

The following ingredients are admixed to provide a masking composition which is used in the manner described in Example 1:

| | % |
|---|---|
| Methylene chloride | 94.00 |
| Monoethanolamine | 1.41 |
| Diatomaceous earth | 3.76 |
| Polymer resin | 0.83 |
| Total | 100.00 |
| Dye | Trace |

Example 3

The following ingredients are admixed to provide a masking composition which is used in the manner described in Example 1:

| | % |
|---|---|
| Methylene chloride | 93.41 |
| Monoethanolamine | 1.40 |
| Diatomaceous earth | 3.73 |
| Polymer resin | 0.73 |
| Nonionic surfactant | 0.73 |
| Total | 100.00 |
| Dye | Trace |

The viscosity of the masking composition of Example 1 was found to be 2200 cps. as measured by using a Brookfield viscometer LVT using a No. 2 spindle at 12 rpm at a temperature of 23° C. Depending on the molecular weight of the binder used will provide a range of viscosity of 1,500 cps. to 4,000 cps. with the median range of about 2200 cps. being the most desirable viscosity of the masking composition.

It will be understood that various changes in the details, materials and compositions, which have been herein described and illustrated in order to explain the nature of the invention, may be made by those skilled in the art wherein the principle and scope of the invention as defined in the appended claims.

What is claimed is:

1. A masking composition comprising 90–95 percent by weight a solvent selected from the group consisting of carbon tetrachloride, ethylene dichloride, methylene chloride, trichloroethylene and perchloroethylene; 0.4–1.5 percent by weight an alkanolamine selected from the group consisting of monoethanolamine, diethanolamine, triethanolamine, monoisopropanolamine, di-isopropanolamine, tri-isopropanolamine, morpholine, N-methyl morpholine and N-ethyl morpholine; 3–5 percent by weight of a silica compound having a particle size of about 1 micron; and 0.7–0.9 percent by weight of a polyethylene oxide homopolymer having a molecular weight of 100,000 to 5,000,000 and a viscosity of 225–4,000 cps.

2. A masking composition according to claim 1 wherein said silica compound is diatomaceous earth.

3. A masking composition according to claim 1 wherein up to 1.5 percent by weight of a nonionic surfactant is added.

4. A masking composition according to claim 1 wherein a trace of rhodamine pink sulfa dye is added to said composition.

5. A masking composition comprising 90–95 percent by weight of methylene chloride, 0.4–1.5 percent by weight of monoethanolamine, 3–5 percent by weight of diatomaceous earth having a particle size of about 1 micron and 0.7–0.9 percent by weight of polyethylene oxide homopolymer having a molecular weight of 100,000 to 5,000,000 and a viscosity of 225–4,000 cps.

6. A masking composition for use to mask selected areas of a member to prevent a covering material from adhering thereonto that comprises:

| | % by weight |
|---|---|
| Methylene chloride | 95.10 |
| Monoethanolamine | 0.46 |
| Diatomaceous earth, particle size of about 1 micron | 3.71 |
| Polyethylene oxide homopolymer having a molecular weight of 100,000 to 5,000,000 and a viscosity of 225–4,000 cps | 0.73 |

7. A masking composition according to claim 6 wherein a trace of rhodamine pink sulfa dye is added to said composition.

8. A masking composition for use to mask selected areas of a member to prevent a covering material from adhering thereonto that comprises:

| | % by weight |
|---|---|
| Methylene chloride | 94.00 |
| Monoethanolamine | 1.41 |
| Diatomaceous earth, particle size of about 1 micron | 3.76 |
| Polyethylene oxide homopolymer having a molecular weight of 100,000 to 5,000,000 and a viscosity of 225–4,000 cps | 0.83 |

9. A masking composition for use to mask selected areas of a member to prevent a covering material from adhering thereonto that comprises:

| | % by weight |
|---|---|
| Methylene chloride | 93.41 |
| Monoethanolamine | 1.40 |
| Diatomaceous earth, particle size of about 1 micron | 3.73 |
| Polyethylene oxide homopolymer having a molecular weight of 100,000 to 5,000,000 and a viscosity of 225–4,000 cps | 0.73 |
| Nonionic surfactant | 0.73 |

* * * * *